United States Patent
Chen et al.

(10) Patent No.: US 10,541,244 B1
(45) Date of Patent: Jan. 21, 2020

(54) LAYOUT PATTERN FOR STATIC RANDOM ACCESS MEMORY

(71) Applicant: UNITED MICROELECTRONICS CORP., Hsin-Chu (TW)

(72) Inventors: Po-Lin Chen, Tainan (TW); Tsung-Hsun Wu, Kaohsiung (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 16/121,609

(22) Filed: Sep. 4, 2018

(30) Foreign Application Priority Data

Aug. 15, 2018 (TW) .............................. 107128432 A

(51) Int. Cl.
| | | |
|---|---|---|
| G11C 11/00 | (2006.01) |
| H01L 27/11 | (2006.01) |
| G11C 11/413 | (2006.01) |
| H01L 27/02 | (2006.01) |
| G11C 11/412 | (2006.01) |
| H01L 27/12 | (2006.01) |

(52) U.S. Cl.
CPC ........ *H01L 27/1104* (2013.01); *G11C 11/412* (2013.01); *G11C 11/413* (2013.01); *H01L 27/0207* (2013.01); *H01L 27/1211* (2013.01)

(58) Field of Classification Search
CPC ............. H01L 27/1104; H01L 27/0207; H01L 27/1211; G11C 11/412; G11C 11/413
See application file for complete search history.

(56) References Cited

U.S. PATENT DOCUMENTS

| | | | |
|---|---|---|---|
| 8,189,368 B2 | 5/2012 | Liaw | |
| 8,315,084 B2 | 11/2012 | Liaw | |
| 8,675,397 B2* | 3/2014 | Liaw | ........................ G11C 8/16 365/154 |
| 10,153,287 B1* | 12/2018 | Wang | ................... H01L 27/1104 |
| 10,396,064 B2* | 8/2019 | Wang | .................... G11C 11/412 |
| 2015/0357279 A1* | 12/2015 | Fujiwara | ............. G06F 17/5077 257/499 |
| 2018/0006038 A1* | 1/2018 | Yeh | ...................... H01L 27/1104 |

* cited by examiner

*Primary Examiner* — Toan K Le
(74) *Attorney, Agent, or Firm* — Winston Hsu

(57) ABSTRACT

The present invention provides a layout pattern of a static random access memory (SRAM), comprising at least two inverters coupled to each other for storing data, each inverter comprising an L-shaped gate structure on a substrate, the L-shaped gate structure includes a first portion arranged along a first direction and a second portion aligned along a second direction, wherein the first portion crosses a first diffusion region to form a pull-up device, and the first portion crosses a second diffusion region and a third diffusion region to form a pull-down device, and each of the inverters includes a local interconnection layer, crossing the second diffusion region and the third diffusion region.

16 Claims, 3 Drawing Sheets

LAYOUT PATTERN FOR STATIC RANDOM ACCESS MEMORY

BACKGROUND OF THE INVENTION

1. Field of the Invention

The invention relates to a static random access memory (SRAM), and more particularly, to a layout pattern of a static random access memory that improves the performance of pull-down transistors (PDs).

2. Description of the Prior Art

An embedded static random access memory (SRAM) comprises a logic circuit and a static random access memory connected to the logic circuit. SRAM is a kind of volatile memory cell, which means it preserves data only while power is continuously applied. SRAM is built of cross-coupled inverters that store data during the time that power remains applied, unlike dynamic random access memory (DRAM) that needs to be periodically refreshed. Because of its high access speed, SRAM is also used in computer systems as a cache memory.

However, as gap of the exposure process decreases, it has been difficult for the current SRAM architecture to produce desirable patterns. Hence, how to enhance the current SRAM architecture for improving exposure quality has become an important task in this field.

SUMMARY OF THE INVENTION

The present invention provides a static random access memory (SRAM) layout pattern, the layout pattern includes two inverters coupling to each other to store data, and the two inverters comprise a first inverter and a second inverter, each of the inverters comprising at least one pull-up transistor (PUs) and at least a pull-down transistor (PDs), each of the inverters comprises an L-shaped gate structure on a substrate, the L-shaped gate structure comprises a first portion arranged along a first direction, and a second portion arranged along a second direction, wherein the first portion crosses a first diffusion region to form the pull-up transistor, wherein the first portion simultaneously crosses a second diffusion region and a third diffusion region to form the pull-down transistor, each of the inverters comprises an inverter output connected to a first access gate structure and a second access gate structure on the substrate, wherein the first access gate structure and the second access gate structure are arranged along the first direction, wherein the first access gate structure crosses the second diffusion region to form a first access element (PG1), the second access gate structure across the third diffusion region to form a second access element (PG2), and each of the inverters comprises a local interconnection layer crossing the second diffusion region and the third diffusion region.

The present invention provides a static random access memory (SRAM) layout pattern, the layout pattern includes two inverters coupling to each other to store data, and the two inverters comprise a first inverter and a second inverter, each of the inverters comprising at least one pull-up transistor (PUs) and at least a pull-down transistor (PDs), each of the inverters includes a step-shaped structure on a substrate, the step-shaped structure comprises a first portion and a second portion arranged along a first direction, and a bridge portion located between the first portion and the second portions, the bridge portion is arranged along a second direction, wherein the first portion crosses a first diffusion region to form the pull-up transistor, wherein the second portion crosses a second diffusion region to form the pull-down device, each of the inverters comprises an inverter output connected to a first access gate structure and a second access gate structure on the substrate, wherein the first access gate structure, the second access gate structure and the first portion are arranged along a same direction, and comprise the same symmetry axis, wherein the first access gate structure crosses the second diffusion region to form a first access element (PG1), the second access gate structure across the third diffusion region to form a second access element (PG2), and each of the inverters comprises a local interconnection layer crossing the second diffusion region and the third diffusion region.

The present embodiment is characterized in that, from the top view, some gate structures are L-shaped structures, and the longer first portion crosses a plurality of diffusion regions, which effectively increases the read current of the pull-down transistor. The shorter second portion partially overlaps the local interconnection layer. Therefore, only one contact plug is needed to electrically connect the above-mentioned gate structure and the local interconnection layer, it has the advantages of simple structure and stability.

According to an embodiment of the invention, when viewed from the top view, some gate structures are step-shaped structures, or looks like a vertical "Z" shaped structure. The second portion of the stepped gate structure crosses the larger area of the diffusion region, thereby effectively increasing the read current of the pull-down transistor.

These and other objectives of the present invention will no doubt become obvious to those of ordinary skill in the art after reading the following detailed description of the preferred embodiment that is illustrated in the various figures and drawings.

DETAILED DESCRIPTION

To provide a better understanding of the present invention to users skilled in the technology of the present invention, preferred embodiments are detailed as follows. The preferred embodiments of the present invention are illustrated in the accompanying drawings with numbered elements to clarify the contents and the effects to be achieved.

Please note that the figures are only for illustration and the figures may not be to scale. The scale may be further modified according to different design considerations. When referring to the words "up" or "down" that describe the relationship between components in the text, it is well known in the art and should be clearly understood that these words refer to relative positions that can be inverted to obtain a similar structure, and these structures should therefore not be precluded from the scope of the claims in the present invention.

Figure 1:
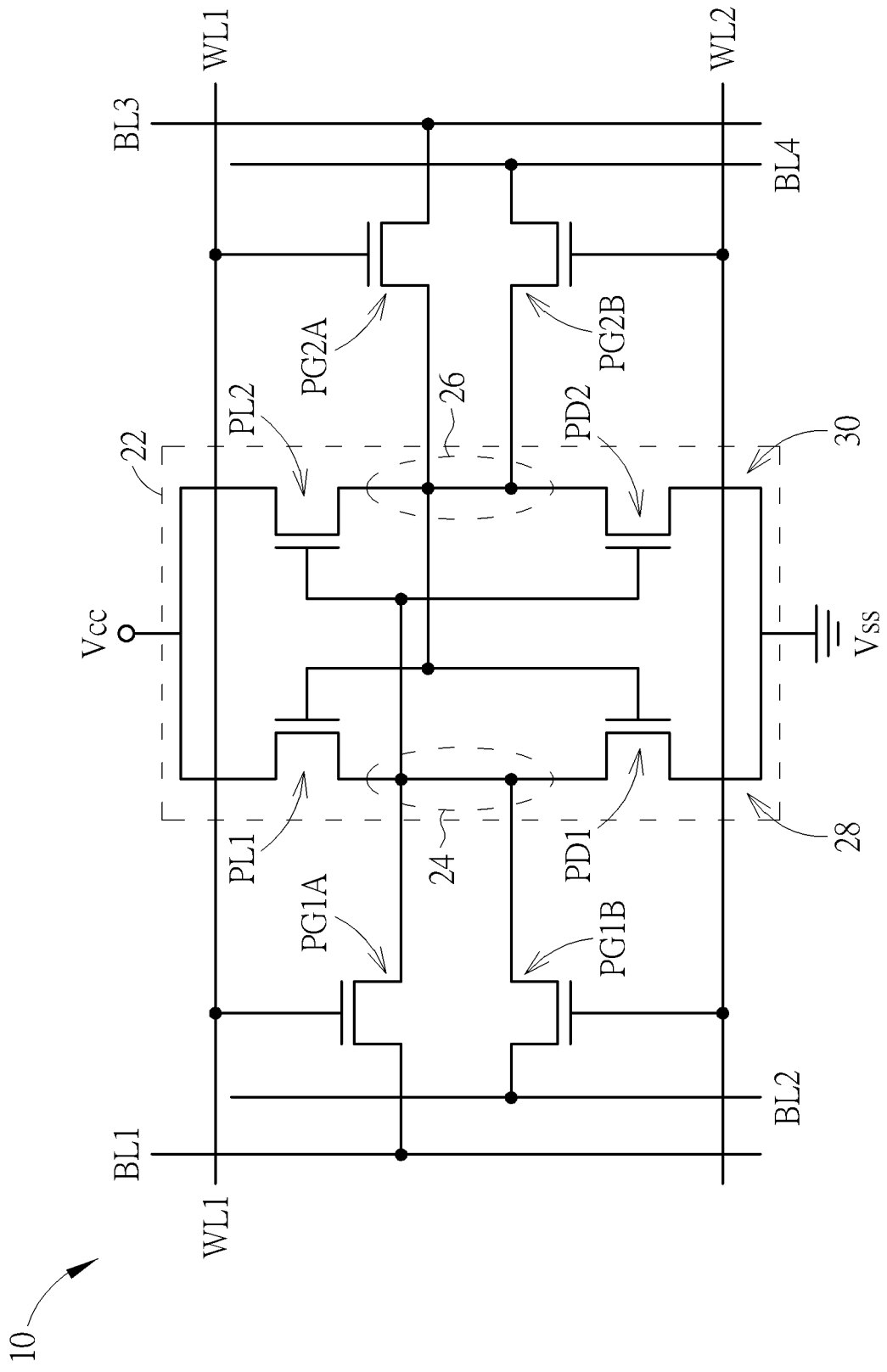
FIG. 1 illustrates a circuit diagram of an eight-transistor SRAM (8T-SRAM) cell according to a first preferred embodiment of the present invention.
Figure 2:
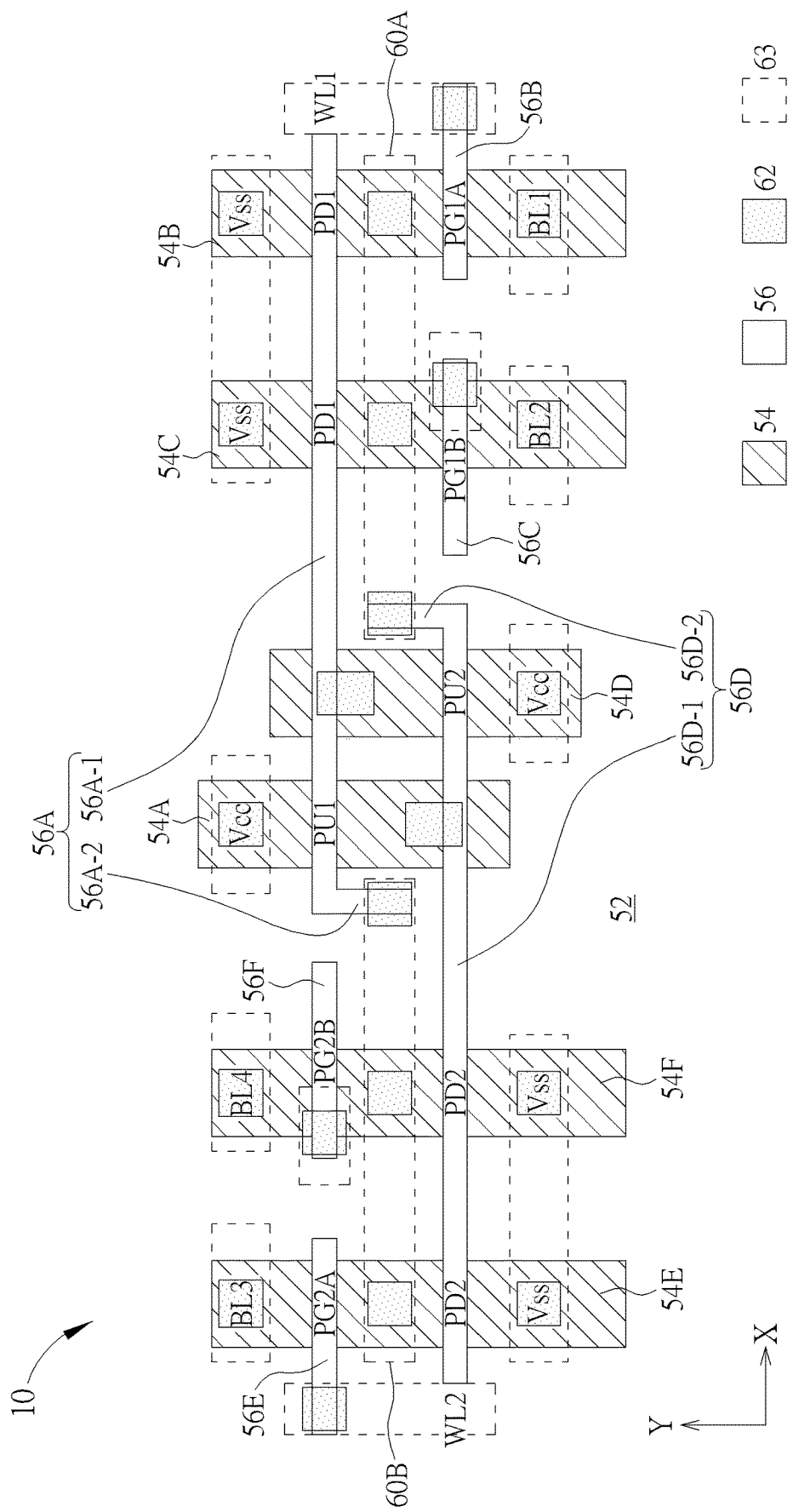
FIG. 2 illustrates a layout diagram of a SRAM according to the first preferred embodiment of the present invention.

Referring to FIGS. 1-2, FIG. 1 illustrates a circuit diagram of an eight-transistor SRAM (8T-SRAM) cell according to a first preferred embodiment of the present invention, and FIG. 2 illustrates a layout diagram of an 8T-SRAM according to the first preferred embodiment of the present invention.

As shown in FIGS. 1-2, the SRAM device of the present invention preferably includes at least one SRAM cell, each SRAM cell including an eight-transistor SRAM (8T-SRAM) cell 10.

In this embodiment, each 6T-SRAM cell 10 is composed of a first pull-up transistor PU1, a second pull-up transistor PU2, and a first pull-down transistor PD1, a second pull-down transistor PD2, a first pass gate transistor PG1A, a second pass gate transistor PG1B, a third pass gate transistor PG2A and a fourth pass gate transistor PG2B. These eight transistors constitute a set of flip-flops. The first and the second pull-up transistors PU1 and PU2, and the first and the second pull-down transistors PD1 and PD2 constitute a latch circuit 22 that stores data in the storage nodes 24 and 26. Since the first and the second pull-up transistors PU1 and PU2 act as power load devices, they can be replaced by resistors. Under this circumstance, the static random access memory becomes a four-transistor SRAM (4T-SRAM). In this embodiment, the first and the second pull-up transistors PU1 and PU2 preferably share a source/drain region and electrically connect to a voltage source (voltage node) Vcc, and the first and the second pull-down transistors PD1 and PD2 share a source/drain region and electrically connect to a voltage source (voltage node) Vss.

Preferably, the first and the second pull-up transistors PU1 and PU2 of the 6T-SRAM cell 10 are composed of p-type metal oxide semiconductor (PMOS) transistors; the first and the second pull-down transistors PD1 and PD2, the first pass gate transistors PG1A, the second pass gate transistors PG1B, the third pass gate transistors PG2A and the fourth pass gate transistors PG2B composed of n-type metal oxide semiconductor (NMOS) transistors, but not limited thereto. The first pull-up transistor PU1 and the first pull-down transistor PD1 constitute an inverter, which further form a series circuit 28. One end of the series circuit 28 is connected to a voltage source Vcc and the other end of the series circuit 28 is connected to a voltage source Vss. Similarly, the second pull-up transistor PU2 and the second pull-down transistor PD2 constitute another inverter and a series circuit 30. One end of the series circuit 30 is connected to the voltage source Vcc and the other end of the series circuit 30 is connected to the voltage source Vss. Each pass gate transistors (including the first pass gate transistor PG1A, the second pass gate transistor PG1B, the third pass gate transistor PG2A and the fourth pass gate transistor PG2B) configured with the two cross-coupled inverters respectively, wherein each of the at least one pull-up transistor (PUs), the at least one pull-down transistors (PDs), and the at least two pass gate transistor (PGs) includes a planar transistor crossing the diffusion region.

The storage node 24 is connected to the respective gates of the second pull-down transistor PD2 and the second pull-up transistor PU2. The storage node 24 is also connected to the drain of the first pull-down transistor PD1, the drain of the first pull-up transistor PU1, the drain of the first pass gate transistor PG1A and the drain of the second pass gate transistor PG1B. Similarly, the storage node 26 is connected to the respective gates of the first pull-down transistor PD1 and first the pull-up transistor PU1. The storage node 26 is also connected to the drain of the second pull-down transistor PD2, the drain of the second pull-up transistor PU2, the drain of the third pass gate transistor PG2A and the drain of the fourth pass gate transistor PG2B.

The gates of the first pass gate transistor PG1A and the third pass gate transistor PG1B are respectively coupled to a first word line (WL1); the gates of the second pass gate transistor PG1B and the fourth pass gate transistor PG2B are respectively coupled to a second word line (WL2); the source of the first pass gate transistor PG1A is coupled to a first bit line (BL1); the source of the second pass gate transistor PG1B is coupled to a second bit line (BL2); the source of the third pass gate transistor PG2A is coupled to a third bit line (BL3); and the source of the fourth pass gate transistor PG2B is coupled to a fourth bit line (BL4).

Please refer to FIG. 2, in this embodiment, an 8T-SRAM cell 10 is disposed on a substrate 52, such as a silicon substrate or silicon-on-insulator (SOI) substrate. A plurality of diffusion regions 54 may be formed in the substrate 52. The diffusion regions 54 are arranged parallel with each other. In addition, a shallow trench isolation (STI, not shown) is disposed between each diffusion region 54.

In addition, a plurality of gate structures 56 are formed on the substrate 52. Each transistor (including the first pull-up transistor PU1, the first pull-down transistor PD1, the second pull-up transistor PU2, the second pull-down transistor PD2, the first pass gate transistor PG1A, the second pass gate transistor PG1B, the third pass gate transistor PG2A, and the fourth pass gate transistor PG2B mentioned above) comprises a gate structure 56 crossing over at least one diffusion region 54, to form the transistors.

In the present invention, the same gate structure simultaneously crosses a plurality of different diffusion regions 54, which helps to increase the gate width of the transistor. In other words, on the equivalent circuit, a plurality of transistors are connected in parallel with each other. Therefore, within a limited area, the read current (Iread) of the transistor is increased, and the operation speed of the overall SRAM can be accelerated.

As shown in FIG. 2, in order to clearly define the positions of the diffusion regions 54 and the gate structures 56, the diffusion regions 54 and the gate structures 56 are labeled indifferent symbols. More precisely, the diffusion regions 54 include a first diffusion region 54A, a second diffusion region 54B, a third diffusion region 54C, and a fourth diffusion region. 54D, a fifth diffusion region 54E, and a sixth diffusion region 54F. The first diffusion region 54A, the second diffusion region 54B and the third diffusion region 54C belong to the same inverter (please also refer to FIG. 1), the fourth diffusion region 54D, the fifth diffusion region 54E and the sixth diffusion region 54F belongs to another inverter. In addition, the gate structure 56 include a first gate structure 56A, a second gate structure 56B, a third gate structure 56C, a fourth gate structure 56D, a fifth gate structure 56E, and a sixth gate structure 56F. It can be understood that all of the first diffusion region 54A to the sixth diffusion region 54F belong to the diffusion region 54. All of the first gate structure 56A to the sixth gate structure 56F belong to the gate structure 56.

It should be noted that the first gate structure 56A and the fourth gate structure 56D in this embodiment are L-shaped structures respectively, and the first gate structure 56A includes a longer first portion 56A-1 and a shorter second portion 56A-2. Similarly, the fourth gate structure 56D includes a longer first portion 56D-1 and a shorter second portion 56D-2. Preferably, both the first gate structure 56A and the second gate structure 56D are integrally formed structures. Taking the first gate structure 56A as an example, the first portion 56A-1 and the second portion 56A-2 of the first gate structure 56A are directly contacting with each other, made of the same material and are simultaneously formed on the same plane.

In this embodiment, the second gate structure 56B, the third gate structure 56C, the fifth gate structure 56E, the sixth gate structure 56F, the first portion 56A-1 of the first gate structure 56A, and the first portion 56D-1 of the fourth gate structure 56D are all arranged along a first direction (such as the X-axis), and each of the diffusion regions 54, the second portion 56A-2 of the first gate structure 56A and the second portion 56D-2 of the fourth gate structure 56D are arranged along a second direction (such as the Y-axis). Preferably, the first direction and the second direction are perpendicular to each other.

In this embodiment, the first portion 56A-1 of the first gate structure 56A crosses the first diffusion region 54A to form a first pull-up transistor PU1, and the first portion 56A-1 of the first gate structure 56A further crosses the second diffusion region 54B and the third diffusion region 54C to form a first pull-down transistor PD1; the second gate structure 56B crosses the second diffusion region 54B to form a first access transistor PG1A; the third gate structure 56C crosses the third diffusion region 54C to form a second access transistor PG1B; the first portion 56D-1 of the fourth gate structure 56D crosses the fourth diffusion region 54D to form a second pull-up transistor PU2, and the first portion 56D-1 of the fourth gate structure 56D further crosses the fifth diffusion region 54E and the sixth diffusion region 54F to form a second pull-down transistor PD2; the fifth gate structure 56E crosses the fifth diffusion region 54E to form a third access transistor PG2A; and the sixth gate structure 56F crosses the sixth diffusion region 54F to form a fourth access transistor PG2B.

It should be noted that, taking the first gate structure 56A in FIG. 2 as an example, the first portion 56A-1 of the first gate structure 56A crosses two different diffusion regions to form two pull-down transistors, but in equivalent circuit, the two pull-down transistors are connected in parallel with each other, so the read current of the first pull-down transistor PD1 is equivalent to the sum of the read currents of the two different pull-down transistors, so that the read current of the first pull-down transistor is greatly increased, and the overall SRAM performance is increased too. Similarly, the fourth gate structure 56D crosses different diffusion regions, and the read current of the second pull-down transistor PD2 can also be increased.

In addition, a plurality of contact plugs 62 and a plurality of contact layers 63 are formed on the substrate 52, the contact plugs 62 and the contact layers 63 are used to connect different transistors (e.g., a gate of the second pull-up transistor PU2 and drain of the first pull-up transistor PU1 are connected to each other through the contact plug 62 and the contact layer 63), or used to connect the transistors to other elements (e.g., a source of the first pull-up transistor PU1 is connected to the voltage source Vcc). In FIG. 2, the elements that connected to each contact plug or each contact layer (for example, the voltage source Vcc, the voltage source Vss, the first word line WL1, the second word line WL2, the first bit line BL1, the second bit line BL2, the third bit line BL3, and the fourth bit line BL4) are labeled on each contact plug 62 or each contact layer 63 directly, to clearly represent the corresponding elements of the contact plugs 62 and the contact layers 63.

The present invention further includes a first local interconnection layer 60A and a second local interconnection layer 60B arranged along the first direction. The first local interconnection layer 60A and the second portion 56D-2 of the fourth gate structure 56D partially overlapped with each other, and only one contact plug 62 is included between the first local interconnection layer 60A and the second portion 56D-2, without including other contact layers 63. In addition, the first local interconnection layer 60A crosses the second diffusion region 54B and the third diffusion region 54C, and the gate of the second pull-up transistor PU2, the drain of the first pull-down transistor PD1, the drain of the first access transistor PG1A and the drain of the second access transistor PG1B are connected together (it corresponding to the storage node 24 in FIG. 1). Further, it is to be noted that the first local interconnection layer 60A and the fourth diffusion region 54D do not overlapped with each other. On the other hand, the second local interconnection layer 60B partially overlaps the second portion 56A-2 of the first gate structure 56A, and only one contact plug 62 is included between the second local interconnection layer 60B and the second portion 56A-2, without including other contact layers 63. In addition, the second local interconnection layer 60B crosses the fifth diffusion region 54E and the sixth diffusion region 54F, and the gate of the first pull-up transistor PU1, the drain of the second pull-down transistor PD2, the drain of the third access transistor PG2A and the drain of the fourth access transistor PG2B are connected together (it corresponding to the storage node 26 in FIG. 1). Furthermore, it is to be noted that the second local interconnection layer 60B does not overlap the first diffusion region 54A.

It is worth noting that in FIG. 2, elements having the same properties contain the same mesh pattern. For example, all gate structures are depicted in the same mesh pattern, and all contact plugs are also depicted in the same mesh pattern. The remaining elements depicted in the present invention are also following this rule. Besides, the first local interconnection layer 60A or the second local interconnection layer 60B have the same properties as the contact layer 63, and they are represented by the same mesh pattern.

In the subsequent steps, other dielectric layers, contact structures, metal layers, and the like are formed to be stacked over the above elements. Since the present invention does not limit the shape, the number, and the like of the subsequent contact structure and the metal layer, it will not be described herein.

The present embodiment is characterized in that, from the top view, some of the gate structure (for example, the first gate structure 56A or the fourth gate structure 56D) is an L-shaped structure, and the longer first portion crosses a plurality of diffusion regions, which effectively increases the read current of the pull-down transistor. The shorter second portion partially overlaps the local interconnection layer (e.g., the first local interconnection layer 60A or the second local interconnection layer 60B). Therefore, only one contact plug is needed to electrically connect the above-mentioned gate structure and the local interconnection layer, it has the advantages of simple structure and stability.

Besides, each of the above-described transistors is exemplified by a planar transistor, that is, a gate structure crosses over the diffusion region. However, in the present invention, a plurality of fin structures may be formed on the substrate, and the original planar transistor may be replaced by a fin-FET, and this structure is also within the scope of the present invention.

The following description will detail the different embodiments of the present invention. To simplify the description, the following description will detail the dissimilarities among the different embodiments and the identical features will not be redundantly described. In order to compare the differences between the embodiments easily, the identical components in each of the following embodiments are marked with identical symbols.

Figure 3:
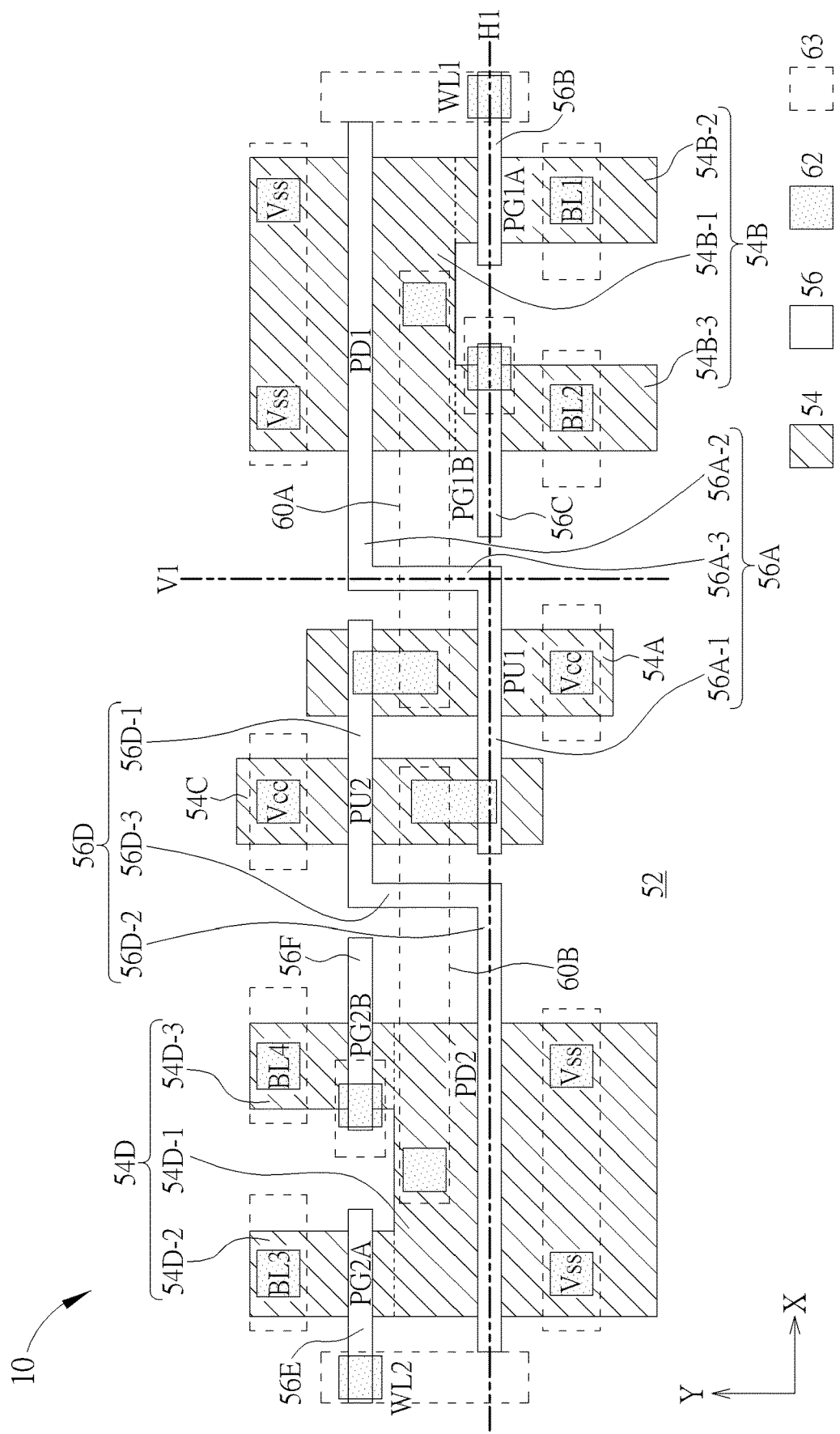
FIG. 3 illustrates a layout diagram of a SRAM according to the second preferred embodiment of the present invention.

Please refer to FIG. 3, which illustrates a layout pattern of a static random access memory (SRAM) according to a second preferred embodiment of the present invention. This embodiment has the same circuit diagram (please refer to FIG. 1) as that of the above embodiment. In the layout pattern, the substrate 52 includes a plurality of gate structures 56, which are respectively labeled as the first gate structure 56A, the second gate structure 56B, the third gate structure 56C, and the fourth gate structure 56D, the fifth gate structure 56E and sixth gate structure 56F shown in FIG. 3, and a plurality of diffusion regions 54, which are respectively labeled as the first diffusion region 54A, the second diffusion region 54B, the third diffusion region 54C, and the fourth diffusion region 54D shown in FIG. 3.

In the present embodiment, when viewed from the top view, the second diffusion region 54B and the fourth diffusion region 54D are U-shaped regions, rather than long strip structures. The second diffusion region 54B includes a first region 54B-1, a second region 54B-2, and a third region 54B-3, the width of the first region 54B-1 (along the X-axis direction in FIG. 3) is greater than the sum of the widths of the second region 54B-2 and the third region 54B-3. Further, the first region 54B-1 directly contacts the second region 54B-2 and the third region 54B-3. Similarly, the fourth diffusion region 54D includes a first region 54D-1, a second region 54D-2, and a third region 54D-3, the width of the first region 54D-1 is greater than the sum of the width of the second region 54D-2 and the width of the third region 5D-3. Further, the first region 54D-1 directly contacts the second region 54D-2 and the third region 54D-3.

In addition, the present invention is characterized in that the first gate structure 56A and the fourth gate structure 56D of each of the inverters are step-shaped structures (from the top view). The first gate structure 56A includes a first portion 56A-1, a second portion 56A-2 and a bridge portion 56A-3. Similarly, the fourth gate structure 56D includes a first portion 56D-1, a second portion 56D-2 and a bridge portion 56D-3.

In addition, in the present embodiment, the second gate structure 56B, the third gate structure 56C, the fifth gate structure 56E, the sixth gate structure 56F, the first portion 56A-1 and the second portion 56A-2 of the first gate structure 56A, the first portion 56D-1 and the second portion 56D-2 of the fourth gate structure 56D are all aligned along a first direction (e.g., the X-axis). The first diffusion region 54A, the third diffusion region 54C, the bridge portion 56A-3 of the first gate structure 56A, and the bridge portion 56D-3 of the fourth gate structure 56D are arranged along a second direction (e.g., the Y-axis). Preferably, the first direction and the second direction are perpendicular to each other. In addition, the first portion 56A-1 of the first gate structure 56A, the second gate structure 56B and the third gate structure 56C have a same symmetry axis (such as the horizontal line H1 shown in FIG. 3), and the first portion 56A-1 and the second portion 56A-2 of the first gate structure 56A have different symmetry axes (e.g., they have different horizontal symmetry axes, in other words, the first portion 56A-1 and the second portion 56A-2 are not aligned with each other in the horizontal direction).

In this embodiment, both the first gate structure 56A and the fourth gate structure 56D have step-shaped structure. In more detail, for the same inverter (that is, including the first pull-up transistor PU1, the first pull-down transistor PD1, the first access transistor PG1A, and the second access transistor PG1B), for example, the first gate structure 56A in FIG. 3 defines that a vertical symmetry line V1 of the bridge portion 56A-3. The first portion 56A-1 is located on one side of the vertical symmetry line V1 (left side of the vertical symmetry line V1 in FIG. 3), and the second portion 56A-2, the second gate structure 56B and the third gate structure 56C are located on the other side of the vertical line V1 (the right side of the vertical symmetry line V1 in FIG. 3).

Preferably, it should be noted that the first gate structure 56A and the fourth gate structure 56D in this embodiment are integrally formed structures. Taking the first gate structure 56A as an example, the first portion 56A-1, the second portion 56A-2, and the bridge portion 56A-3 of the first gate structure 56A are in direct contact with each other, made of the same material and are simultaneously formed on a same plane.

In this embodiment, the first portion 56A-1 of the first gate structure 56A crosses the first diffusion region 54A to form the first pull-up transistor PU1, the second portion 56A-2 of the first gate structure 56A crosses the first region 54B-1 of the second diffusion region 54B to form the first pull-down transistor PD1; the second gate structure 56B crosses the second region 54B-2 of the second diffusion region 54B to form the first access transistor PG1A; the third gate structure 56C crosses the third region 54B-3 of the second diffusion region 54B to form the second access transistor PG1B; the first portion 56D-1 of the fourth gate structure 56D crosses the third diffusion region 54C to form the second pull-up transistor PU2, the second portion 56D-2 of the fourth gate structure 56D crosses the first region 54D-1 of the fourth diffusion region 54D to form the second pull-down transistor PD1; the fifth gate structure 56E crosses the second region 54D-2 of the fourth diffusion region 54D to form the third access transistor PG2A; the sixth gate structure 56F crosses the third region 54B-3 of the fourth diffusion region 54D to form the fourth access transistor PG2B.

It is to be noted that, taking the first gate structure 56A in FIG. 3 as an example, the second portion 56A-2 of the first gate structure 56A crosses the first region 54B-1 of the second diffusion region 54B. Since the first region 54B-1 has a larger width (along the X-axis direction) than the sum of the widths of the second region 54B-2 and the third region 54B-3, so that the read current of the first pull-down transistor PD1 can be greatly increased, thereby increasing the overall SRAM performance. Similarly, the fourth gate structure 56D crosses the first region 54D-1 of the fourth diffusion region 54D having a larger area, and the read current of the second pull-down transistor PD2 can also be increased.

In addition, a plurality of contact plugs 62 and a plurality of contact layers 63 are formed on the substrate 52, the contact plugs 62 and the contact layers 63 are used to connect different transistors (e.g., a gate of the second pull-up transistor PU2 and drain of the first pull-up transistor PU1 are connected to each other through the contact plug 62 and the contact layer 63), or used to connect the transistors to other elements (e.g., a source of the first pull-up transistor PU1 is connected to the voltage source Vcc). In FIG. 2, the elements that connected to each contact plug or each contact layer (for example, the voltage source Vcc, the voltage source Vss, the first word line WL1, the second word line WL2, the first bit line BL1, the second bit line BL2, the third bit line BL3, and the fourth bit line BL4) are labeled on each contact plug 62 or each contact layer 63 directly, to clearly represent the corresponding elements of the contact plugs 62 and the contact layers 63.

The present invention further includes a first local interconnection layer 60A and a second local interconnection layer 60B, when viewed from the top view, both of which are arranged along the first direction, and the bridge portion 56A-3 or the bridge portion 56D-3 partially overlap with the first local interconnection layer 60A or the second local interconnection layer 60B. When the first gate structure 56A and the fourth gate structure 56D are integrally formed structures, the first local interconnection layer 60A and the second local interconnection layer 60B may be formed in a dielectric layer, and the dielectric layer is located in an upper layer that disposed above the dielectric layer where the first gate structure 56A and the fourth gate structure 56D are located.

It is worth noting that in FIG. 3, elements having the same properties contain the same mesh pattern. For example, all gate structures are depicted in the same mesh pattern, and all contact plugs are also depicted in the same mesh pattern. The remaining elements depicted in the present invention are also following this rule. Besides, the first local interconnection layer 60A or the second local interconnection layer 60B have the same properties as the contact layer 63, and they are represented by the same mesh pattern.

In the subsequent steps, other dielectric layers, contact structures, metal layers, and the like are formed to be stacked over the above elements. Since the present invention does not limit the shape, the number, and the like of the subsequent contact structure and the metal layer, it will not be described herein.

This embodiment is characterized in that, when viewed from the top view, some gate structures (e.g., the first gate structure 56A or the fourth gate structure 56D) are step-shaped structures, or looks like a vertical "Z" shaped structure. The second portion of the stepped gate structure crosses the larger area of the diffusion region, thereby effectively increasing the read current of the pull-down transistor.

Besides, each of the above-described transistors is exemplified by a planar transistor, that is, a gate structure crosses over the diffusion region. However, in the present invention, a plurality of fin structures may be formed on the substrate, and the original planar transistor may be replaced by a fin-FET, and this structure is also within the scope of the present invention.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A static random access memory (SRAM) layout pattern, comprising:
   two inverters coupling to each other to store data, and the two inverters comprise a first inverter and a second inverter, each of the inverters comprising at least one pull-up transistor (PUs) and at least a pull-down transistor (PDs);
   each of the inverters comprises an L-shaped gate structure on a substrate, the L-shaped gate structure comprises a first portion arranged along a first direction, and a second portion arranged along a second direction, wherein the first portion crosses a first diffusion region to form the pull-up transistor, wherein the first portion simultaneously crosses a second diffusion region and a third diffusion region to form the pull-down transistor;
   each of the inverters comprises an inverter output connected to a first access gate structure and a second access gate structure on the substrate, wherein the first access gate structure and the second access gate structure are arranged along the first direction, wherein the first access gate structure crosses the second diffusion region to form a first access element (PG1), the second access gate structure across the third diffusion region to form a second access element (PG2); and
   each of the inverters comprises a local interconnection layer crossing the second diffusion region and the third diffusion region.

2. The static random access memory layout pattern of claim 1, wherein when viewed from a top view, the L-type gate structure of the first inverter partially overlaps the local interconnection layer of the second inverter.

3. The static random access memory layout pattern of claim 2, wherein the second portion of the L-type gate structure of the first inverter partially overlaps the local interconnection layer of the second inverter.

4. The static random access memory layout pattern of claim 1, wherein the local interconnection layer does not overlap the first diffusion region.

5. The static random access memory layout pattern of claim 1, wherein the first direction and the second direction are perpendicular to each other.

6. The static random access memory layout pattern of claim 1, wherein the first diffusion region of the second inverter is located between the first diffusion region of the first inverter and the third diffusion region of the first inverter.

7. A static random access memory (SRAM) layout pattern, comprising:
   two inverters coupling to each other to store data, and the two inverters comprise a first inverter and a second inverter, each of the inverters comprising at least one pull-up transistor (PUs) and at least a pull-down transistor (PDs);
   each of the inverters includes a step-shaped structure on a substrate, the step-shaped structure comprises a first portion and a second portion arranged along a first direction, and a bridge portion located between the first portion and the second portions, the bridge portion is arranged along a second direction, wherein the first portion crosses a first diffusion region to form the pull-up transistor, wherein the second portion crosses a second diffusion region to form the pull-down device;
   each of the inverters comprises an inverter output connected to a first access gate structure and a second access gate structure on the substrate, wherein the first access gate structure, the second access gate structure and the first portion are arranged along a same direction, and comprise the same symmetry axis, wherein the first access gate structure crosses the second diffusion region to form a first access element (PG1), the second access gate structure across the second diffusion region to form a second access element (PG2); and
   each of the inverters comprises a local interconnection layer crossing the second diffusion region.

8. The static random access memory layout pattern of claim 7, wherein the first direction and the second direction are perpendicular to each other.

9. The static random access memory layout pattern of claim 7, wherein the first portion is located on one side of the bridge portion, the second portion, the first access gate structure, and the second access gate structure are located on the other side of the bridge portion.

10. The static random access memory layout pattern of claim 7, wherein when viewed from a top view, the second diffusion region is an U-shaped region having a first region, a second region, and a third region, wherein a width of the first region is greater than a width of the second region and a width of the third region.

11. The static random access memory layout pattern of claim 10, wherein the second portion of the stepped structure crosses the first region of the second diffusion region.

12. The static random access memory layout pattern of claim 10, wherein the first access gate structure crosses the second region of the second diffusion region.

13. The static random access memory layout pattern of claim 10, wherein the second access gate structure crosses the third region of the second diffusion region.

14. The static random access memory layout pattern of claim 10, wherein the first region directly contacts the second region and the third region.

15. The static random access memory layout pattern of claim 7, wherein the first portion and the second portion of the stepped structure have different symmetry axes.

16. The static random access memory layout pattern of claim 7, wherein the second access gate structure is located between the first access gate structure and the first portion.

* * * * *